(12) United States Patent
Baldo et al.

(10) Patent No.: US 6,884,093 B2
(45) Date of Patent: Apr. 26, 2005

(54) ORGANIC TRIODES WITH NOVEL GRID STRUCTURES AND METHOD OF PRODUCTION

(75) Inventors: Marc Baldo, Princeton, NJ (US); Peter Peumans, Princeton, NJ (US); Stephan Forrest, Princeton, NJ (US); Changsoon Kim, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 51 days.

(21) Appl. No.: 10/246,508

(22) Filed: Sep. 17, 2002

(65) Prior Publication Data

US 2003/0015698 A1 Jan. 23, 2003

Related U.S. Application Data

(62) Division of application No. 09/677,765, filed on Oct. 3, 2000, now abandoned.

(51) Int. Cl.$^7$ .............................................. H01L 51/40
(52) U.S. Cl. ........................ 439/99; 436/193; 436/587; 436/665
(58) Field of Search ........................ 438/99, 193, 587, 438/665; 257/40

(56) References Cited

U.S. PATENT DOCUMENTS

| | | |
|---|---|---|
| 4,149,904 A | 4/1979 | Jones |
| 4,399,605 A | 8/1983 | Dash et al. |
| 4,586,240 A | 5/1986 | Blackstone et al. |
| 4,713,676 A | 12/1987 | Thim |

(Continued)

FOREIGN PATENT DOCUMENTS

EP 0 977 280 2/2000

OTHER PUBLICATIONS

Murray A. Lampert, et al., *Current Injection in Solids*, Academic Press, NY, 1970, pp. 44–83.

Kudo et al., "Organic Static Induction Transistor for Display Devices", *Synthetic Metals*, 111:11–14, Jun. 1, 2000.

Kudo et al., "Organic Static Induction Transistor for Color Sensors", *Synthetic Metals*, 102:(1–3) 900–903, Jun. 1999.

(Continued)

*Primary Examiner*—Sara Crane
(74) *Attorney, Agent, or Firm*—Kenyon & Kenyon

(57) ABSTRACT

An organic semiconductor device is provided. The device has a first electrode and a second electrode, with an organic semiconductor layer disposed between the first and second electrodes. An electrically conductive grid is disposed within the organic semiconductor layer, which has openings in which the organic semiconductor layer is present. At least one insulating layer is disposed adjacent to the electrically conductive grid, preferably such that the electrically conductive grid is completely separated from the organic semiconductor layer by the insulating layer. Methods of fabricating the device, and the electrically conductive grid in particular, are also provided. In one method, openings are formed in an electrically conductive layer with a patterned die, which is then removed. In another method, an electrically conductive layer and a first insulating layer are etched through the mask to expose portions of a first electrode. In yet another method, a patterned die is pressed into a first organic semiconductor layer to create texture in the surface of the first organic semiconductor layer, and then removed. An electrically conductive material is then deposited onto the first organic semiconductor layer from an angle to form a grid having openings as a result of the textured surface and the angular deposition. In each of the methods, insulating layers are preferably deposited or otherwise formed during the process to completely separate the electrically conductive layer from previously and subsequently deposited organic semiconductor layers.

13 Claims, 15 Drawing Sheets

U.S. PATENT DOCUMENTS

| | | |
|---|---|---|
| 4,740,266 A | 4/1988 | Wu |
| 5,172,385 A | 12/1992 | Forrest et al. |
| 5,276,380 A | 1/1994 | Tang |
| 5,294,869 A | 3/1994 | Tang et al. |
| 5,294,870 A | 3/1994 | Tang et al. |
| 5,315,129 A | 5/1994 | Forrest et al. |
| 5,315,219 A | 5/1994 | Kishi |
| 5,411,426 A | 5/1995 | Boysel |
| 5,510,156 A | 4/1996 | Zhao |
| 5,512,131 A * | 4/1996 | Kumar et al. ............... 438/738 |
| 5,563,424 A | 10/1996 | Yang et al. |
| 5,588,894 A | 12/1996 | Jin et al. |
| 5,681,196 A | 10/1997 | Jin et al. |
| 5,703,436 A | 12/1997 | Forrest et al. |
| 5,707,745 A | 1/1998 | Forrest et al. |
| 5,772,905 A * | 6/1998 | Chou .......................... 216/44 |
| 5,811,833 A | 9/1998 | Thompson |
| 5,861,219 A | 1/1999 | Thompson et al. |
| 5,865,657 A | 2/1999 | Haven et al. |
| 5,865,659 A | 2/1999 | Ludwig et al. |
| 5,925,259 A | 7/1999 | Biebuyck et al. |
| 5,998,803 A | 12/1999 | Forrest et al. |
| 6,019,658 A | 2/2000 | Ludwig et al. |
| 6,048,630 A | 4/2000 | Burrows et al. |
| 6,228,698 B1 | 5/2001 | Luo |
| 6,498,114 B1 * | 12/2002 | Amundson et al. ......... 438/780 |

OTHER PUBLICATIONS

C.C. Wu, et al., *Appl. Phys. Lett.,* "Surface Modification of Indium Tin Oxide by Plasma Treatment: An Effective Method to Improve the Efficiency, Brightness, and Reliability of Organic Light Emitting Devices," Mar. 17, 1997, vol. 70, No. 11, pp. 1348–1350.

P.E. Burrows, et al., *Appl. Phys. Lett.,* "Color–tunable Organic Light–Emitting Devices," Nov. 11, 1996, vol. 69, No. 20, pp. 2959–2961.

Zilan Shen, et al., *Science,* "Three–Color, Tunable, Organic Light–Emitting Devices," Jun. 27, 1997, vol. 276, pp. 2009–2011.

P.E. Burrows, et al., "Control of Microcavity Effects in Full Color Stacked Organic Light Emitting Devices," pp. 1–11.

John C.C. Fan, et al., *Journal of Applied Physics,* "X–ray Photoemission Spectroscopy Studies of Sn–doped Indium–Oxide Films," Aug. 1997, vol. 48, No. 8, pp. 3524–3531.

Sze, S.M. and Gummel, H.K. "Appraisal of Semiconductor–metal–Semiconductor Transistor" *Solid–State Electronics.* Pergamon Press, New York. 1966. vol. 9, pp. 751–769.

Crowell, C.R. and Size, S.M. Quantum–Mechanical Reflection of Electrons at Metal–Semiconductor Barriers: Electron Transport in Semiconductor–Metal–Semiconductor Structures. *Journal of Applied Physics.* Jun. 1966. vol. 37, No. 7, pp 2683–2689.

Kawai, Satoshi and Ueda, Ryuzo "Amagnetic Properties of Anodic Oxide Coatings on Aluminum Containing Electrodeposited Co and Co–Ni" *Journal of the Electrochemical Society.* Jan. 1975. vol. 122, No. 1, pp. 32–36.

Chang, L.L. and Esaki, L., "Tunnel triode—a tunneling base transistor" *Applied Physics Letters.* Jul.–Dec. 1977. vol. 31, pp. 687–689.

Forrest, S.R. and Witten, Jr., T.A., "Long–renge correlation in smoke–particle aggregates". *Journal of Physics A: Mathematical and General.* May 1979. vol. 12, No. 5, pp. L109–L117.

Rosencher, E., et al. "Realization and Electrical Properites of a Monolithic Metal–Base Transistor: The Si/CoSi$_2$/Si Structure" *Physica B+C Europhysics Journal.* 1985. vol. B+C, pp 106–110.

Luryi, Serge. "Hot–electron Transport in Heterstructure Devices" *Physica B+C Europhysics Journal.* 1985. vol. B+C, pp 453–465.

Saito, M., et al. "Micropolarizer made of the anodized alumina film." *Applied Physics Letters.* Aug. 14, 1989, vol. 55, No. 7, pp. 607–609.

Tonucci, R.J. et al. "Nanochannel Array Glass." *Science.* Oct. 30, 1992. vol. 258, pp 783–785.

Huber, C.A.. et al. "Nanowire Array Composites." *Science.* Feb. 11, 1994. vol. 263, pp 800–802.

Widawski, Gene, et al. "Self–organized honeycomb morphology of star–polym r polystyren films." Nature : International Weekly Journal of Science, Jun. 2, 1994. vol. 369, No. 6479, pp. 387–389.

Masuda, Hid ki and Fukuda, Kenji "Ordered M tal Nanohol Arrays Made By a Two–step R plication of Honeycomb structur s of Anodic Alumina." *Science.* Jun. 9, 1995. vol. 268, pp 1466–1468.

Burrows, P.E., et al. "Relationship between electroluminescence and current transport in organic heterojunction light–emitting devices". *Journal of Applied Physics.* May 15, 1996. vol. 79, No. 10, pp. 7991–8006.

Routkevitch, Dmitri, et al. "Nonlithographic Nano–Wire Arrays: Fabrication, Physics, and Devic Applications." *IEEE Transactions on Electron Devices.* Jul. 1996. vol. 43, No. 7, pp. 1646–1658.

Bao, Zhenan et al. "High–Performance Plastic Transistors Fabricated by Printing Techniques." *Chemistry of Materials.* 1997, vol. 9, No. 6, pp1299–1301.

Lin, Ten–Yi, et al. "Pentacene–Based Organic Thin–film Transistors." *IEEE Transactions on Electron Devices.* Aug. 1998. vol. 44 No. 8, pp. 1325–1331.

Berggren, M., et al. "Organic solid–state lasers with imprinted gratings on plastic substrates." *Applied Physics Letters.* Jan. 26, 1998. vol. 72, No. 4, pp. 410–411.

Klauk, Hagen, et al. "Fast Organic Thin–Film Transistor Circuits." *IEEE Electron Device Letters.* Jun. 1999. vol. 20, No. 6, pp 289–291.

Kim, C., et al., "Micropatterning of Organic Electronic Devices by Cold–Welding." *Science.* May 5, 2000, vol. 288, pp 831–833.

Yang, et al., "A new architecture for polymer transistors," Letters to Nature, vol. 372 pp. 344–346 (Nov. 24, 1994).

McElvain, et al., "An analytic model for the polymer grid triode," J. App. Phys. 80(8) p. 4755–4766 (Oct. 15, 1996).

McElvain, et al., "Fullerene–based polymer grid triodes," J. App. Phys., 81(9) pp. 6468–6472 (May 1, 1997).

Kudo, et al., "Schottky gate static induction transistor using copper phthalocyanine films," Thin Solid Films, 331 (1998) pp. 51–54.

Wang, et al., "Device Characteristics of Organic Static Induction Transistor Using Copper Phthalocyanine Flims and Al Gate Electrode," Jpn. J. Appl. Phys., vol. 38 (1999) Pt. 1, No. 1A pp. 256–259.

Gewartowski, "Principles of Electron Tubes," Chapter 5, pp. 149–182, Princeton, NJ, 1965.

* cited by examiner

ORGANIC TRIODES WITH NOVEL GRID STRUCTURES AND METHOD OF PRODUCTION

CROSS-REFERENCE TO RELATED APPLICATION

This application is a division of U.S. Ser. No. 09/677,765, filed Oct. 3, 2000, now abandoned.

RESEARCH AGREEMENTS

The claimed invention was made by, on behalf of, and/or in connection with one or more of the following parties to a joint university-corporation research agreement: Princeton University, The University of Southern California, and the Universal Display Corporation. The agreement was in effect on and before the date the claimed invention was made, and the claimed invention was made as a result of activities undertaken within the scope of the agreement.

GOVERNMENT RIGHTS

This invention was made with Government support under Contract No. DMR94-00362 awarded by the National Science Foundation and Contract No. F49620-96-1-0277 awarded by the Air Force Office of Scientific Research. The government has rights in this invention.

FIELD OF INVENTION

This invention is generally directed to organic semiconductor devices, and is more specifically directed to organic triode devices and methods of their production.

BACKGROUND INFORMATION

It is widely recognized that organic devices offer major opportunities for the construction of large area circuits, due in large part to their relatively low processing costs and their compatibility with various substrates. One such device is the organic transistor, or more specifically, the organic triode. Potential applications for organic transistors include large area active matrix displays, particularly those using organic light emitting devices (OLEDs), and data storage devices, such as smart cards.

While a number of organic triode structures have been proposed, each has its shortcomings. For example, organic triode (or more generally organic transistor) structures are proposed in Yang, "A new architecture for polymer transistors," Letters to Nature vol. 372 p. 344 (November 1994); U.S. Pat. No. 5,563,424 to Yang (Uniax Corp.); McElvain, "An analytic model for the polymer grid triode," J. App. Phys. 80(8) p. 4755 (October 1996); McElvain, "Fullerene-based polymer grid triodes," J. App. Phys. 81(9) p. 6468 (May 1997); Kudo, "Schottky gate static induction transistor using copper phthalocyanine films," Thin Solid Films 331 (1998) 51–54; Wang, "Device Characteristics of Organic Static Induction Transistor Using Copper Phthalocyanine Films and Al Gate Electrode," Jpn. J. Appl. Phys. Vol. 38 (1999) Pt. 1, No. 1A p. 256; and U.S. Pat. No. 5,563,424 to Yang. However, these structures generally have one or more problems associated with them, such as a requirement of high resolution lithography, high operating voltages (such as high gate voltage swings required to fully turn off drain current, or high base voltages required to create a suitable electric field), low number of on/off cycles, low gain, significant leakage from the grid.

SUMMARY OF THE INVENTION

The present invention relates to an organic triodes, and methods of fabricating the same.

In one embodiment of the invention, a method of fabricating a device is provided. A first organic semiconductor layer is deposited onto a first electrode, followed by an electrically conductive layer. Openings are formed in the electrically conductive layer with a patterned die, which is then removed. A second organic semiconductor layer is then deposited over the grid and the first organic semiconductor layer, followed by a second electrode. Preferably, insulating layers are deposited or otherwise formed during the process to completely separate the electrically conductive layer from the organic semiconductor layers.

In another embodiment of the invention, a method of fabricating a device is provided. A first insulating layer is deposited onto a first electrode, followed by an electrically conductive layer. A patterned mask is then created on top of the first electrically conductive layer. The electrically conductive layer and the first insulating layer are then etched through the mask to expose portions of the first electrode. An organic semiconductor layer is deposited over the first electrode, first insulating layer, and first electrically conductive layer. A second electrode is then deposited over the organic semiconductor layer. Preferably, additional insulating layers are deposited or otherwise formed during the process to completely separate the electrically conductive layer from the organic semiconductor layers.

In another embodiment of the invention, a method of fabricating a device is provided. A first organic semiconductor layer is deposited onto a first electrode. A patterned die is pressed into the first organic semiconductor layer to create texture in the surface of the first organic semiconductor layer. The patterned die is then removed. A conductor is then deposited onto the organic semiconductor layer from an angle to form a grid having openings as a result of the textured surface and the angular deposition. A second organic semiconductor layer is deposited over the grid and the first organic semiconductor layer, followed by a second electrode. Preferably, insulating layers are deposited or otherwise formed during the process to completely separate the electrically conductive layer from the organic semiconductor layers.

In another embodiment of the invention, an organic semiconductor device is provided. The device has a first electrode and a second electrode, with an organic semiconductor layer disposed between the first and second electrodes. An electrically conductive grid is disposed within the organic semiconductor layer, which has openings in which the organic semiconductor layer is present. At least one insulating layer is disposed adjacent to the electrically conductive grid.

In another embodiment of the invention, an organic semiconductor device is provided. The device has a first electrode, a first organic semiconductor layer, an electrically conductive grid, a second organic semiconductor layer, and a second electrode, disposed in that order. The second organic semiconductor layer is in contact with the first organic semiconductor layer through openings in the grid. At least one insulating layer is disposed adjacent to the electrically conductive grid, such that the electrically conductive grid is completely separated from the first and second organic layers by the insulating layers.

DETAILED DESCRIPTION

Several methods of fabricating organic triodes that have desirable features are provided. These features include low operating voltage, a large number of on/off cycles during the life of the device, high gain, negligible leakage from the grid, and high drive current. In particular, operating voltages of less than about 5 V may be obtained, on/off cycles in excess of about 10,000, negligible leakage from the grid, extremely high current gain, voltage gain in excess of 1.0, and drive currents in excess of 1 A/cm$^2$. It is believed that the superior characteristics of these triodes are due in part to the methods used to fabricate the grids. Moreover, these desirable features are provided using fabrication techniques that are convenient and inexpensive when compared to, for example, high resolution photolithography using conventional masks and photoresist.

Figure 1:
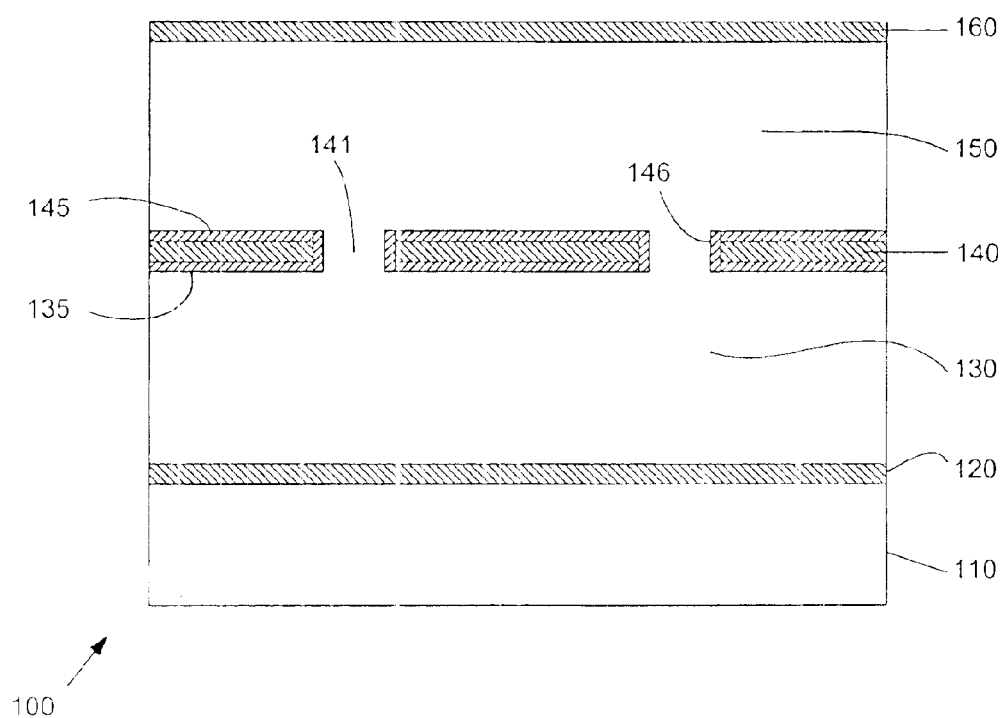
FIG. 1 schematically shows an organic triode.

FIG. 1 schematically shows an organic triode 100. A first electrode 120, a first organic semiconductor layer 130, a grid 140, a second organic semiconductor layer 150, and a second electrode 160 are stacked, in that order, on top of a substrate 110. First electrode 120 and second electrode 160 are connected to a voltage source (not shown) such that a voltage difference may be applied across the electrodes. The voltage at grid 140 may be separately controlled. Preferably, grid 140 is covered by one or more insulating layers, such as first insulating layer 135, second insulating layer 145, and side insulating layer 146, that reduce or eliminate contact between grid 140 on one hand, and first and second organic semiconductor layers 130 and 150 on the other. Grid 140, as well as insulating layers 135 and 145, have at least one opening 141 therein through which organic semiconductor layer 130 and second organic semiconductor 150 are in electrical contact. Preferably, any surface of grid 140 that is in contact with organic semiconductor layers 135 or 145 has been treated such that current flow is reduced, or preferably such that current may not flow between grid 140 and the organic semiconductor layers. This may be achieved, for example, by fabricating insulating layers 135 and 145 such that no surface of grid 140 is exposed to organic semiconductor layers 130 and 150. Alternatively, any surface of grid 140 that is not covered by insulating layers 135 and 145 may be oxidized, such that the oxide layer acts as an insulator.

Organic triode 100 may be operated as a transistor, i.e., the current flow between first electrode 120 and second electrode 160 may be controlled by the voltage at grid 140. This operation is analogous to that of a conventional vacuum tube, where organic semiconductor layers 130 and 150 correspond to the vacuum, and the majority charge carriers in these organic layers, whether holes or electrons, correspond to the electrons of a vacuum tube. Grid 140 corresponds to the grid of a vacuum tube, and first and second electrodes 120 and 160 correspond to the anode and cathode of the vacuum tube (not necessarily in that order). By way of example, first and second organic semiconductor layers 130 and 150 may be formed of hole transporting materials, i.e., holes are the majority charge carriers in these layers. Second electrode 160 may have a positive voltage, and first electrode 120 may be connected to ground (zero voltage).

When no voltage is applied to the grid, second electrode 160 injects holes into organic layer 150 due to the positive voltage at second electrode 160. The voltage difference between second electrode 160 and first electrode 120 drives these holes from second electrode 160, through organic semiconductor layers 150 and 130, to first electrode 120. Because grid 140 is at zero voltage, these holes flow freely through openings 141 in grid 140. This corresponds to the operation of a conventional transistor in the "saturation" region.

If, on the other hand, a sufficiently high positive voltage is applied to grid 140, several effects may occur that reduce or eliminate the flow of holes. First, the positive voltage at grid 140 may alter the electric field of second electrode 160 to reduce or eliminate hole injection, a phenomena referred to as "grid controlled injection." Second, the positive voltage at grid 140 repels holes, reducing or preventing their flow through openings 141. This corresponds to the operation of a conventional transistor in the "cut-off" region.

Somewhere between zero voltage and a high positive voltage, the current flow through grid 140 varies dependent upon the voltage at grid 140, with greater current flow at lower voltages. This corresponds to the operation of a conventional transistor in the "active" region. First and second organic semiconductor layers 130 and 150 may also be formed of electron transporting materials. Also, the direction of the voltage bias may be changed, such that first electrode 120 is negative relative to second electrode 160. Irrespective of what type of charge carrier is used, the electrode that injects charge carriers into the organic material may be referred to as the "injecting electrode." This electrode serves the same function as the anode in a conventional vacuum tube.

Optimal Characteristics Of Organic Triodes

From the foregoing, several desirable characteristics of organic triodes are apparent. The injecting electrode, when operated in the saturation region, should have good charge carrier injection. The grid, on the other hand, should be a poor injector of charge carriers. Otherwise, the voltage applied at the grid for the purpose of reducing or stopping current flow might actually result in the creation of "leakage" current. Insulating layers, such as insulating layers 135 and 145, may be used to inhibit injection from the grid. Preferably, semiconductor layers 130 and 150 have predominantly one type of charge carrier, either holes or electrons, and the minority charge carrier is present in only small concentrations.

An important measure of triode performance is the gain of the triode. There are several types of gain. Among the most important are current gain and voltage gain.

Current gain is determined by the leakage of current from the grid into the semiconductor layers. In particular, current gain is the current flowing between the two electrodes, divided by the current leaking from the grid and flowing to an electrode. Ideally, there is no such leakage, and the current gain is infinite. Some of the fabrication methods and structures disclosed herein allow this ideal to be approached, in that leakage, if any, is extremely small, and the current gain is correspondingly large.

Voltage gain is a measure of how much voltage at the grid is required to move the transistor from the saturated region to the cut-off region, for a given voltage at the injecting electrode. High voltage gains are preferred over low voltage gains, because the state of a high voltage gain triode may be controlled with a low grid voltage. Conventional vacuum tubes generally have voltage gains of over 10, and a voltage gain of at least one is preferable for a useful triode.

For a triode where electrons are injected at the anode, similar to a conventional vacuum tube, the voltage gain may be described as:

$$\mu_{es} = -\frac{V_a}{V_g}\bigg|_{\tau_c=0} \quad (1)$$

where the voltage gain is $\mu_{es}$. $V_g$ is the grid voltage required to turn the triode off for a given injecting electrode voltage $V_a$. $\tau_c=0$ indicates that the charge density at the cathode is zero when the triode is off.

Figure 10:
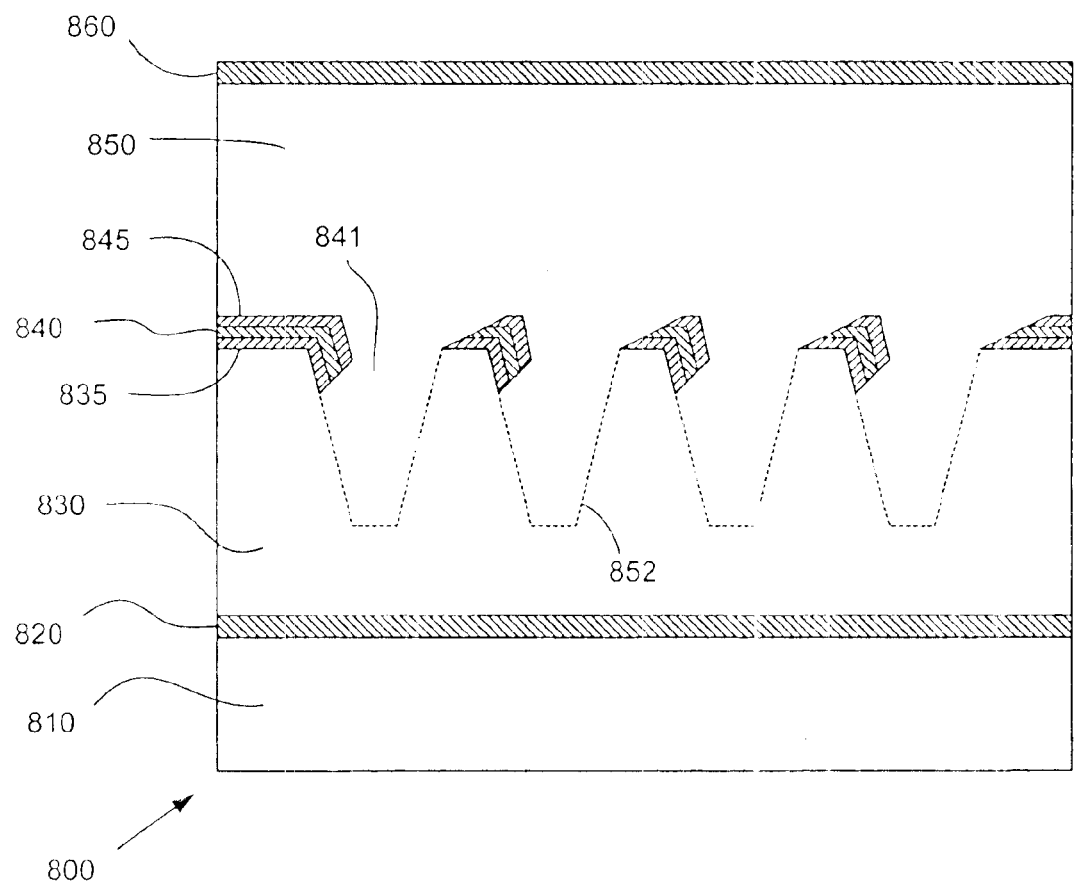
FIG. 10 schematically shows organic triode 800 after it has been fully fabricated.

A simple triode structure having a grid comprised of parallel cylindrical wires, somewhat similar to the triode of FIG. 10 but with cylindrical grid wires, may be used to approximate useful design parameters for organic triodes. This analysis is described in greater detail in Chapter 5 of Gewartowski, "Principles of Electron Tubes," pp. 149–182, Princeton, N.J., 1965, which is incorporated by reference. The electrostatic amplification factor for such a triode can be determined analytically for such a geometry, and is well approximated by:

$$\mu_{es} = -\frac{2\pi d_{ga}}{P\log\left(2\sin\frac{\pi R}{P}\right)}, \quad (2)$$

where, $d_{ga}$ is the gate to anode distance;

P is the grid pitch, i.e., the spacing of the grid wires; and

R is the radius of the grid wires.

Equation (2) can be used to determine useful design parameters for an organic triode. For most useful operation the voltage gain, $\mu_{es}$, should be greater than one. In general, 2000 Å is a triode thickness that may be achieved using conventionally available equipment to deposit the various layers. One set of parameters that results in a triode having a voltage gain greater than one is:

grid pitch P≦1000 Å;

grid radius R<P/6, i.e., R<160 Å;

grid positioned as close as possible to the cathode, i.e. $d_{ga}$≈2000 Å, $d_{cg}$≈80 Å, where $d_{cg}$ is the distance from the grid to the cathode.

This set of parameters requires the use of a nanostructure for the grid.

For the organic triodes of the present invention, in which the grid typically comprises a thin metal layer with holes through which the charge carriers may flow, the holes in the grid have an average diameter or average width that is less than the distance $d_{cg}$ of the grid from the cathode. The holes in the grid may have an average diameter or average width that is substantially less than the grid-to-cathode distance $d_{cg}$, with the actual relative dimensions being determined so as to achieve the desired overall combination of triode performance characteristics.

The grid is preferably positioned as close to the cathode as can be reliably fabricated. In particular, a grid-to-cathode distance of less than about 100 nm is preferred, with a distance of about 50 nm or less still more preferred. This means that the average diameter or average width of the holes in the grid are preferably less than about 100 nm or, still more preferably, less than about 50 nm.

It is believed that by fabricating organic triodes having such small nano-dimensions, in combination with grids that are electrically insulated, organic triode characteristics may be realized that are substantially superior to known organic triode devices. Such devices may be fabricated using either small molecules or polymers as the semiconductive organic layers.

Fabrication of Organic Triodes by Nano-Imprinting

In a first embodiment of the invention, an organic triode is provided having a grid formed by nano-imprinting. A first electrode, a first organic semiconductor layer, and a metal sheet are deposited, in that order, on a substrate. Preferably, insulating layers are deposited immediately before and after the metal sheet. The metal sheet, and any insulating layers that are present, are then patterned using a patterned die having raised surfaces. The die is pressed onto the metal sheet, such that the raised surfaces on the die form holes in the metal sheet. This metal sheet with holes is the grid of the organic triode. After removing the die, a second organic semiconductor layer and a second electrode are deposited, in that order, over the grid. Preferably, the grid is completely enclosed by insulating layers, such that there is no direct contact between the grid and the organic semiconductor, and current is blocked from flowing between the grid and the organic semiconductor.

In a first variation of the first embodiment, the die may have metal or a similar material on the raised surfaces that will cold-weld to the metal sheet. In this embodiment, portions of the metal sheet stick to the die and are removed from the device.

In a second variation of the first embodiment, the die may be designed such that the metal sheet does not stick to the die. In this embodiment, the raised surfaces of the die break off portions of the metal sheet and press them into the first organic layer. These portions remain in the first organic layer, and do not interfere with the operation of the organic triode.

Figure 2:
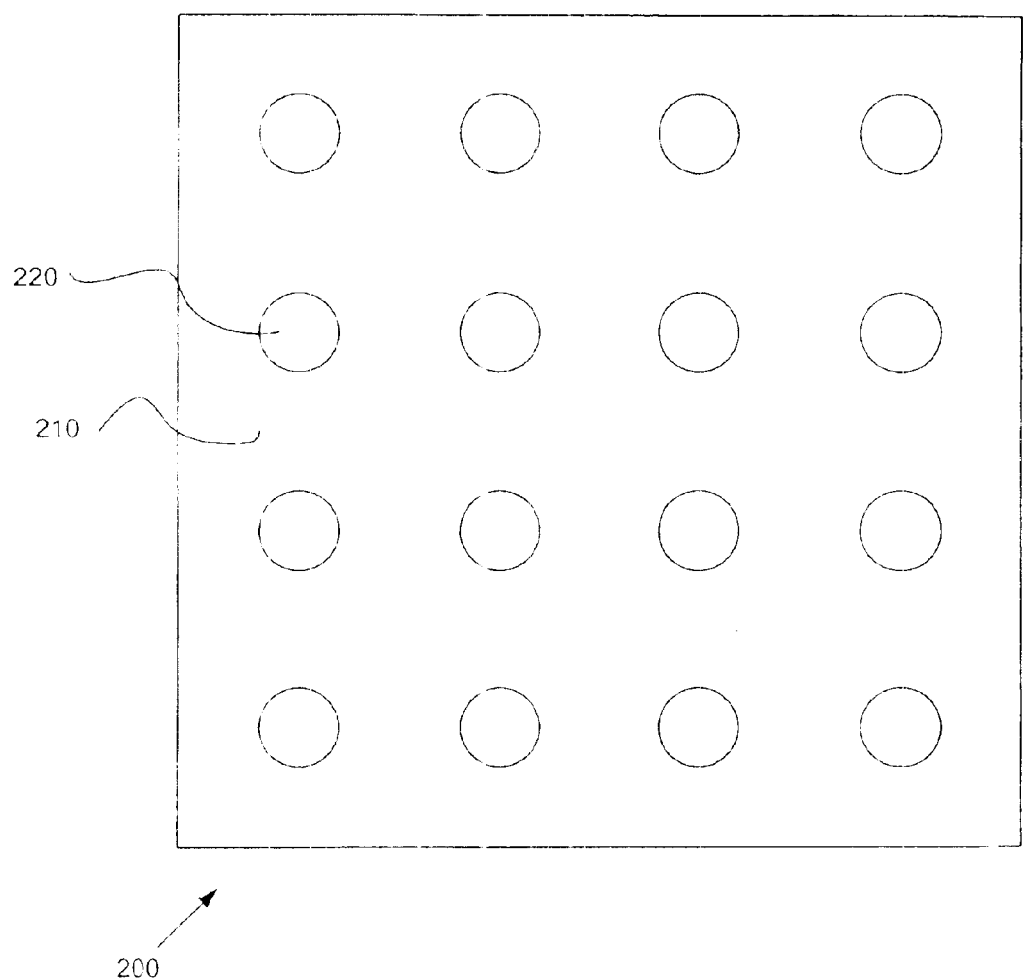
FIG. 2 schematically shows a die 200 adapted for use with the first embodiment FIG. 3 schematically shows a partially fabricated organic triode 300 in accordance with the first variation of the first embodiment FIG. 4 schematically shows the partially fabricated organic triode of FIG. 3 after further processing FIG. 5 schematically shows organic triode 300 of FIGS. 3 and 4 after it has been fully fabricated FIG. 6 schematically shows an organic triode 600 fabricated in accordance with the second variation of the first embodiment.

FIG. 2 schematically shows a patterned die 200 adapted for use with the first embodiment, looking at the side of the die that is pressed against the metal sheet. Die 200 has a base 210 and raised portions 220. Although die 200 is illustrated with cylindrical raised portions, the first embodiment may be practiced with many other shapes, such as squares or ridges. The round top surfaces of raised portions 220 may be treated such that portions of the metal sheet or any insulating layer that may be present stick to the die in accordance with the first variation of the first embodiment, or such that there is no sticking in accordance with the second variation of the first embodiment.

Die 200 may be fabricated from material that can be fabricated into the desired shape, and that is strong and hard enough to perform its function as a die. Silicon is particularly preferred, because silicon is suitably strong and hard, and the technology for creating features of the desired size in silicon is well developed. However, any number of other materials may be suitable.

Figure 3:
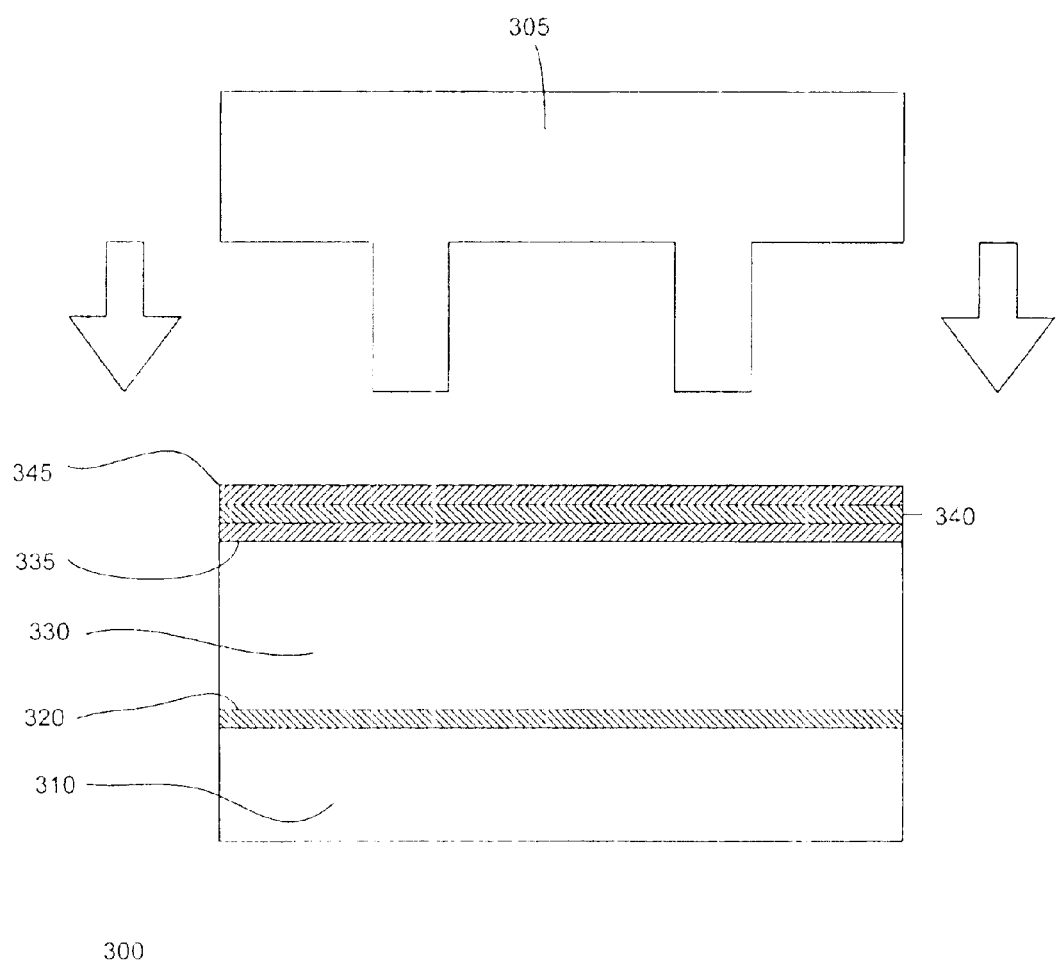

FIG. 3 schematically shows a partially fabricated organic triode 300 in accordance with the first variation of the first embodiment. First electrode 320, first organic layer 330, first insulating layer 335, grid 340, and second insulating layer 345 have been deposited, in that order, on substrate 310. At this point, grid 340 may be a contiguous sheet of metallic material that does not necessarily have openings therein. Patterned die 305, which may be similar to die 200 viewed from a different direction, is positioned above second insulating layer 345, such that raised portions 306 of die 305 are ready to be pressed through second insulating layer 345, metal layer 340, and first insulating layer 335 into first organic layer 330.

Figure 4:
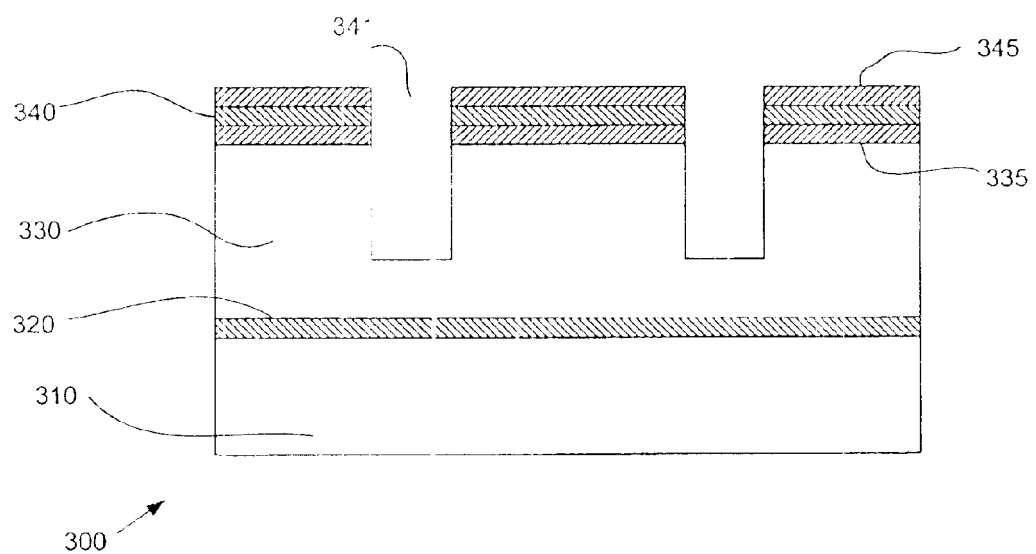

FIG. 4 schematically shows the partially fabricated organic triode 300 of FIG. 3 after further processing. In particular, die 305 has been pressed through second insulating layer 345, grid 340, and first insulating layer 335 into first organic layer 330, and then removed. As a result, openings 341 are formed in second insulating layer 345, grid 340, and first insulating layer 335. The materials of these layers and the process parameters are selected such that insulating layers 335 and 345, as well as metal layer 340, stick to each other and to raised portions 306 of die 305 during the patterning process, such that the portions of insulating layers 335 and 345, and metal layer 340 situated below raised portions 306 are removed during patterning.

The patterning with die 305 may be performed after the deposition of grid 340, but before the deposition of second insulating layer 345. This alternative may be preferable when second insulating layer 345 is made of a material that will not readily stick to die 305. Care must be taken during the subsequent deposition of second insulating layer 345 to avoid completely blocking openings 341.

Preferably, raised portions 306 are coated with a metal or metal alloy so that grid 340 will stick to the raised portions during patterning. Non-oxidizing materials, such as gold or silver, are preferred.

Figure 5:
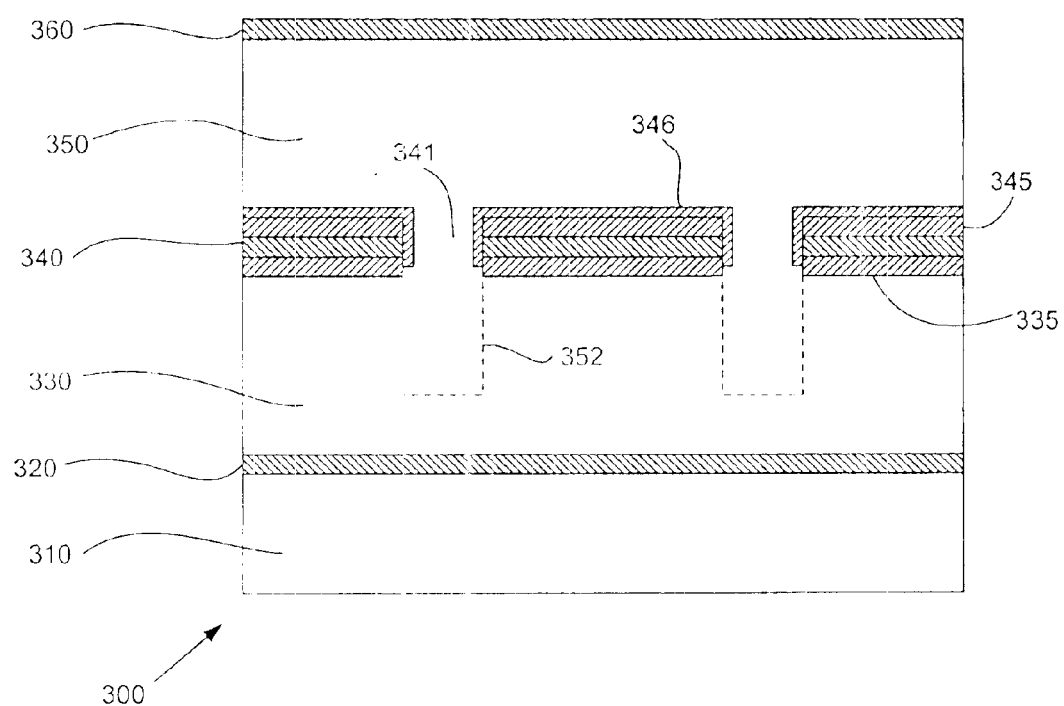

FIG. 5 schematically shows organic triode 300 of FIGS. 3 and 4 after it has been fully fabricated. Side insulating layer 346 has been deposited over any remaining exposed areas of grid 340. Side insulating layer 346 may be deposited, for example, from an angle while rotating triode 300. In this way, side insulating layer 346 can cover the exposed sides of grid 340 without blocking openings 341. Note that the scope of the insulating coverage provided by side insulating layer 346 may be such that second insulating layer 345 can be omitted, without exposing any part of grid 340 to organic layers. Second organic semiconductor layer 350 has been deposited over the exposed portions of first organic semiconductor layer 330, first insulating layer 335, grid 340 (preferably there are no such exposed areas of grid 340), second insulating layer 345, and side insulating layer 346. Second electrode 360 has also been deposited over second organic semiconductor layer 350. Interface 352 is shown where first organic semiconductor layer 330 contacts second organic semiconductor layer 350. This interface is formed where second organic semiconductor layer 350 deposits through openings 341 onto first organic semiconductor layer 330. Ideally, first and second semiconductor layers 330 and 350 operate as a single semiconductor layer with grid 340 situated therein, i.e., interface 352 does not act as an impediment to the flow of current.

Preferably, once triode 300 is fully fabricated, grid 340 is completely separated from organic semiconductor layers 330 and 350 by insulating layers, such that current is blocked from flowing between grid 340 and the organic semiconductor layers. This goal may be accomplished in a number of ways. If side insulating layer 346 is omitted, any surfaces of grid 340 that are exposed after patterning with die 305 may be oxidized prior to the deposition of second organic layer 350, such that the oxide forms an insulating layer. Care must be taken during such oxidation to avoid damaging organic semiconductor layer 330. Alternatively, insulating material may be deposited from an angle, after patterning with die 305, to form side insulating layer 346. Choosing a suitable deposition angle will allow insulating material to be deposited on any exposed surface of grid 340, while leaving surfaces of organic semiconductor layer 330 exposed. This angular deposition may be performed while triode 300 is rotated, or may be performed from multiple angles, to ensure complete coverage of all exposed surfaces of grid 340. The angular deposition may be performed before or after depositing second insulating layer 345, or may be combined with the deposition of second insulating layer 345. This step will result in the deposition of insulating material on top of grid 340, as well as any exposed sides of grid 340.

Figure 6:
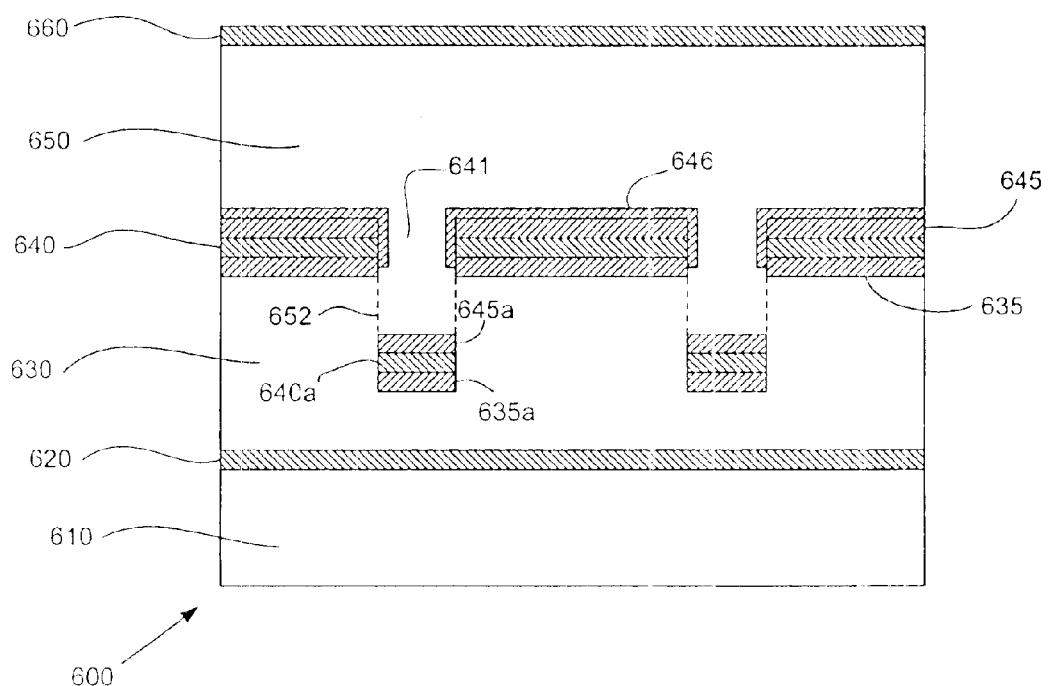

FIG. 6 schematically shows an organic triode 600 fabricated in accordance with the second variation of the first embodiment. Substrate 610, first electrode 620, first organic semiconductor layer 630, first insulating layer 635, grid 640, second insulating layer 645, side insulating layer 646, second organic semiconductor layer 650 and second electrode 660 correspond to substrate 310, first electrode 320, first organic semiconductor layer 330, first insulating layer 335, grid 340, second insulating layer 345, side insulating layer 346, second organic semiconductor layer 350 and second electrode 360, respectively, of organic triode 300 of FIG. 6. Grid 640 is patterned with a patterned die having raised portions, similar to die 305, to form openings 641. However, the process parameters and the materials of the die, first insulating layer 635, grid 640, and second insulating layer 645 are chosen such that portions 635a, 640a and 645a of first insulating layer 635, grid 640, and second insulating layer 645, respectively, do not stick to the die, and are left behind when the die is removed. As a result, portions 635a, 640a and 645a remain embedded in triode 600. These portions are present at what would otherwise have been a part of interface 651 between first organic semiconductor layer 630 and second organic semiconductor layer 650.

The embodiments of FIGS. 2–6 may be fabricated using a wide variety of dimensions and materials. A few examples are provided as follows.

Preferably, the die used for patterning has raised portions having dimensions on the order of about 0.2 microns, with a center to center spacing of about 0.4 microns. For example, with reference to FIG. 2, raised portions 210 may have a diameter of about 50–200 nm, respectively, with a center to center distance of about 100–400 nm. Dimensions outside of this range may also be used, but are presently not favored due to cost and performance factors. In particular, larger dimensions sacrifice performance, but may be used due to the lower cost. Smaller dimensions may lead to smaller devices, but are not favored at the present time due to cost and reliability. With the dimension described, a pressure on the order of 100 MPa may be used to press the die into the device during patterning.

Any one of a variety of known hole transporting or electron transporting materials may be used for the organic semiconductor layers. Preferably, the organic semiconductor layers in a particular device are fabricated from the same material, or at least a material having the same type of majority charge carrier. Exemplary materials include those disclosed in U.S. Pat. No. 6,048,630 (Burrows et al.), U.S. Pat. No. 5,998,803 (Forrest et al.), U.S. Pat. No. 5,861,219 (Thompson et al.), U.S. Pat. No. 5,811,833 (Thompson), U.S. Pat. No. 5,703,436 (Forrest et al.) and U.S. Pat. No. 5,294,870 (Tang et al.). Preferred organic hole conducting organic semiconductor materials include 3,4,9,10-perylenetetracarboxylic dianhydride (PTCDA), copper phthalocyanine (CuPc), and 4,4'-bis[N-(1-napthyl)-N-phenylamino]-biphenyl (α-NPD). Exemplary electron conducting organic semiconductor materials include tris-(8-hydroxyquinoline) Al (Alq3) and 3,4,9,10-perylenetetracarboxylic bis-benzimidazole (PTCBI), $F_{16}$CuPc and 60-diaphene.

The grid may be made of any suitable electrically conductive material. Devices using hole conducting organic semiconductor layers preferably have a grid made of a high work function material (work function greater than about 5 eV). Suitable high work function metals include Au and Pt. Similarly, devices using electron conducting semiconductor layers preferably have a grid made of a low work function material (work function less than about 4 eV). Suitable low work function metals include Al, Ca and Mg. These combinations of materials will result in a device that may be switched on and off without the use of a negative voltage, which simplifies the control circuitry. Other combinations of materials may be used, i.e., a low work function metal in conjunction with an electron conducting semiconductor material. However, these combinations may require more complex control circuitry.

The thickness of the grid is preferably about 10–50 nm, although thicknesses outside of that range may be used. Significantly higher thicknesses may make fabrication more difficult. For example, pressing the die through a thicker grid may be difficult. Significantly thinner grids may be too resistive.

The insulating layers may be made of any material that suitably blocks current from flowing from the grid into the semiconductor layers. $SiN_x$ and $SiO_2$ are preferred due to the large existing base of knowledge regarding these materials. Non-conductive polymers, such as polyimide, may also be used. Such materials are typically deposited by spin coating.

The thickness of the insulating layers is preferably about 5–50 nm, although thicknesses outside of this range may be used. Significantly thicker insulating layers may make fabrication more difficult. Significantly thinner insulating layers may leak current.

The thicknesses of each organic semiconductor layer is preferably about 20–200 nm, although the invention may be practiced using a wide variety of thicknesses. Thicker organic layers may adversely affect device performance. Thinner organic layers may be difficult to consistently and inexpensively fabricate using currently available technology, but may be preferred when such technology becomes more readily available. Preferably, thicknesses of 50–100 nm are used.

Particular combinations of grid and insulator materials may be preferred because the processing technology relating to these combinations is well developed. Gold or aluminum grids used in conjunction with $SiN_x$ insulating layers are two such combinations.

The materials and dimensions preferred for the embodiment of FIGS. 2–6 are also preferred for the other embodiments.

Fabrication of Organic Triodes by Angular Deposition

In a second embodiment of the invention, an organic triode is provided having a grid formed by angular deposition of the grid over a textured surface. A first electrode and a first organic semiconductor layer are deposited, in that order, on a substrate. The first organic semiconductor layer is patterned to create a textured surface. For example, this patterning may be accomplished by pressing a patterned die having raised surfaces into the first organic semiconductor layer. An electrically conductive material, such as a metal, is then deposited from an angle onto the first organic semiconductor layer to form the grid. Because the organic semiconductor layer is textured, there are gaps in the grid. Insulating layers may be deposited immediately before and after the electrically conductive material, also from an angle, to reduce or eliminate contact between the electrically conductive layer and the organic semiconductor layers. A second organic semiconductor layer and a second electrode are deposited, in that order, over the grid. Preferably, the grid is completely enclosed by insulating layers, such that there is no direct contact between the grid and the organic semiconductor, and current is blocked from flowing between the grid and the organic semiconductor.

Any textured surface that results in such gaps may be used. For example, a textured surface having a series of parallel ridges and valleys may be used to create a grid comprising a series of parallel lines. Alternatively, a textured surface having an array of depressions may be used to create a grid comprising a sheet having an array of openings therein.

Figure 7:
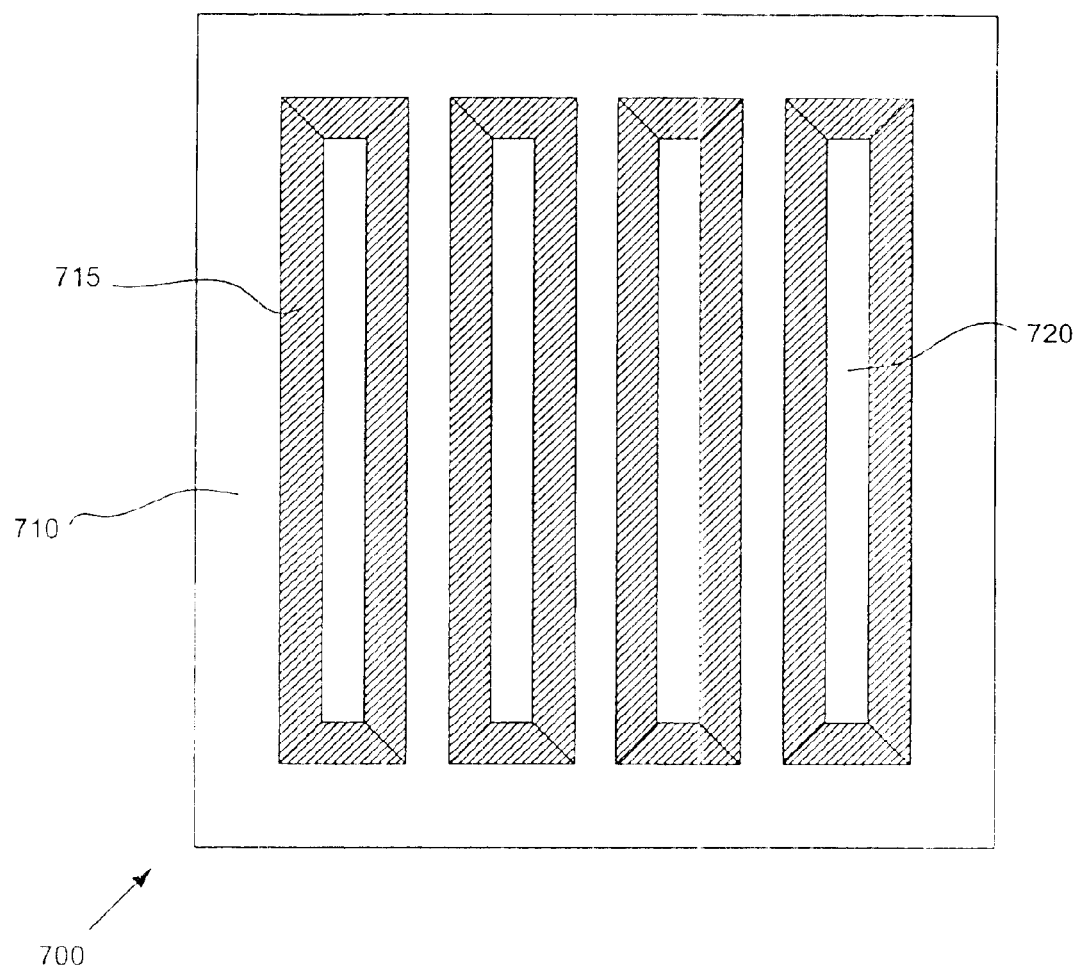
FIG. 7 schematically shows a die 700 adapted for use with the second embodiment.

FIG. 7 schematically shows a patterned die 700 adapted for use with the second embodiment. Die 700 has a base 710 and raised portions 720. Regions 715 are the sloped areas between base 710 and raised portions 720. Raised portions 720 are ridges, although any number of other shapes, such as raised cylinders or raised squares, may be used.

Figure 8:
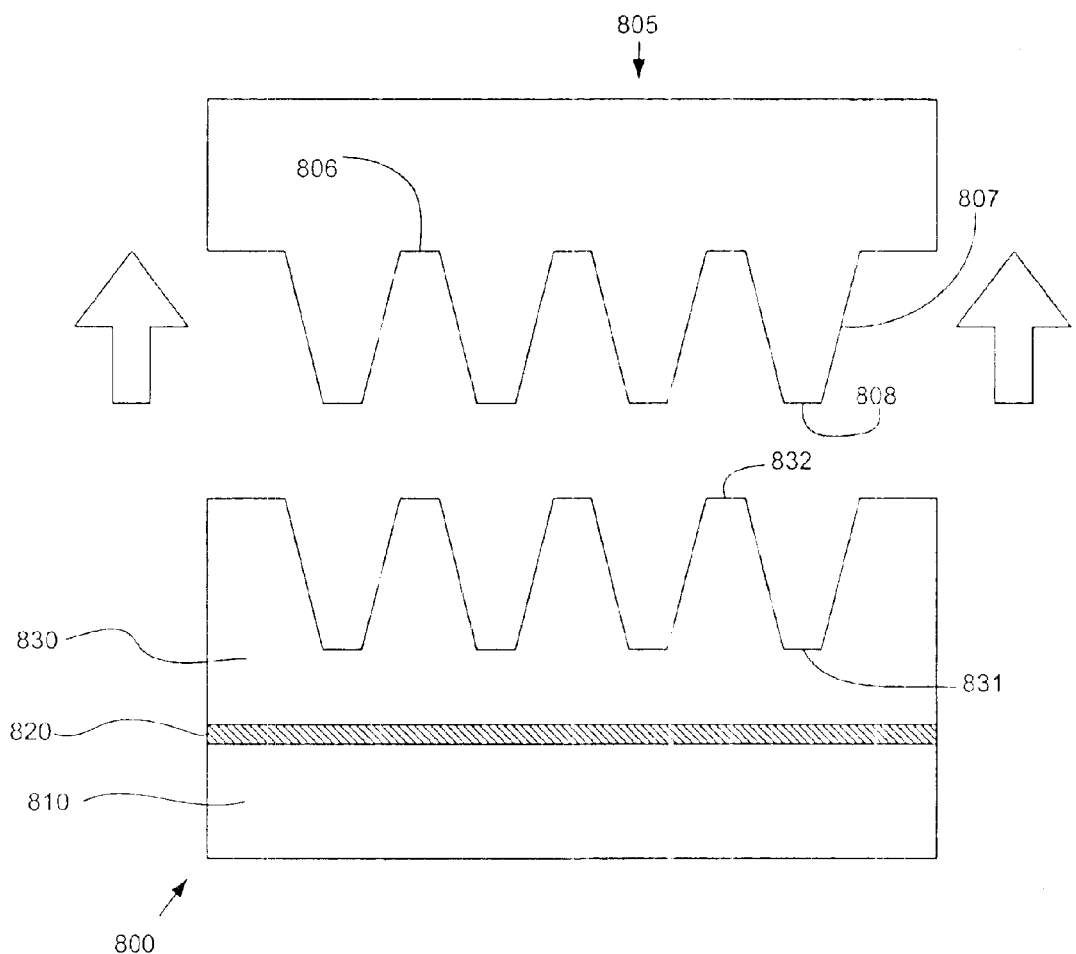
FIG. 8 schematically shows a partially fabricated organic triode 800 in accordance with the second embodiment FIG. 9 schematically shows the partially fabricated organic triode of FIG. 8 after further processing.

FIG. 8 schematically shows a partially fabricated organic triode 800 in accordance with the second embodiment. First electrode 820 and first organic layer 830 have been deposited, in that order, on substrate 810. Patterned die 805, which may be similar to die 700 viewed from a different direction, has a base 806, sloped areas 807, and raised portions 808 that correspond to base 710, sloped areas 715, and raised portions 720 of die 700, respectively. Die 805 has been used to create texture in first organic semiconductor layer 830. As a result, first organic semiconductor layer 830 has depressed portions 831 where raised portions 806 of die 805 contacted organic semiconductor layer 830, and raised portions 832 elsewhere.

Figure 9:
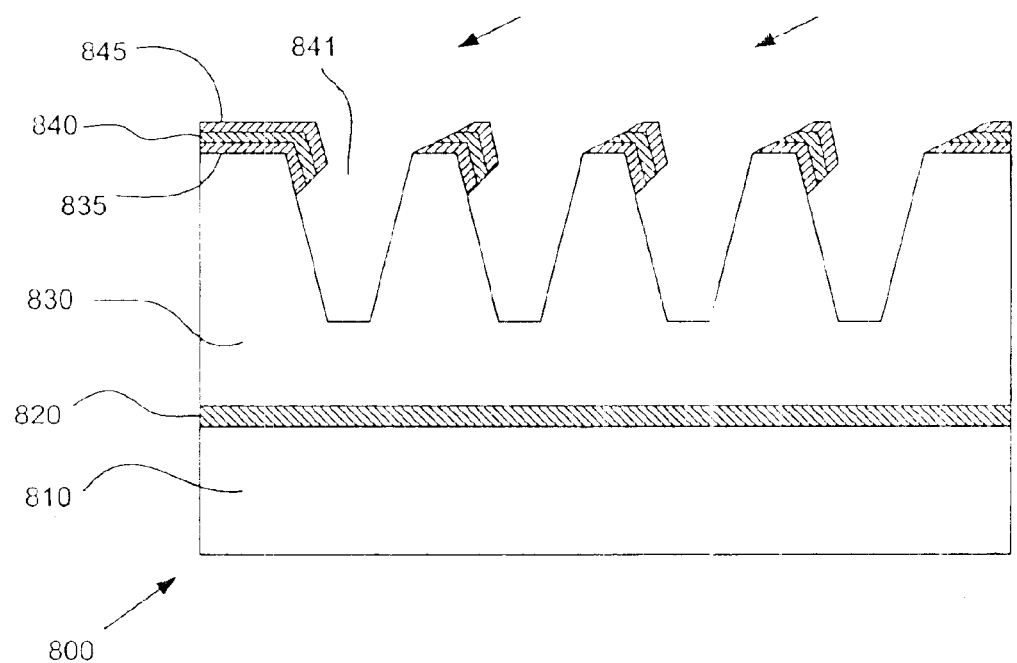

FIG. 9 schematically shows the partially fabricated organic triode 800 of FIG. 8 after further processing. In particular, first insulating layer 835, metal layer 840, and second insulating layer 845 have been deposited over first organic semiconductor layer 830 from an angle. Due to the angular deposition and the texture of first organic semiconductor 830, gaps 841 are formed in first insulating layer 835, metal layer 840, and second insulating layer 845.

Preferably, once triode 800 is fully fabricated, grid 840 is completely separated from organic semiconductor layers 830 and 840 by insulating layers, such that current is blocked from flowing between grid 840 and the organic semiconductor layers. This goal may be accomplished in a number of ways. Preferably, the angle of deposition is varied during the deposition of the insulating layers, or each insulating layer is deposited in multiple steps from different angles. By using such a technique, the insulating layers can be made wider than grid 840, such that grid 840 is completely enclosed by insulating layers 835 and 845. Alternatively (or in addition, as a precaution against exposed grid), any exposed surfaces of grid 840 may be oxidized after the deposition of second insulating layer 845, but prior to the deposition of second organic layer 850, such that the oxide forms an insulating layer. Care must be taken during such oxidation to avoid damaging organic semiconductor layer 830.

FIG. 10 schematically shows organic triode 800 after it has been fully fabricated. Second organic semiconductor layer 850 has been deposited over the exposed portions of first organic semiconductor layer 830, first insulating layer 835, grid 840, and second insulating layer 845. Second electrode 860 has also been deposited over second organic semiconductor layer 850. Interface 852 is shown where first organic semiconductor layer 830 contacts second organic semiconductor layer 850. Ideally, first and second semiconductor layers 830 and 850 operate as a single semiconductor layer with grid 840 situated therein, i.e., interface 852 does not act as an impediment to the flow of current. Viewed from the top, triode 800 of FIG. 10 has a grid similar in shape to base 710 of die 700.

Preferred materials and dimensions are the same as for the embodiments of FIGS. 2–6.

Fabrication of Organic Triodes with A Mask

In a third embodiment of the invention, an organic triode is provided having a grid formed using a mask. Preferably, the mask is created using small particles, such as balls, that have been reduced in size. A first electrode, a first insulating layer, a grid, and a second insulating layer are deposited, in that order, on a substrate. The mask is then created over the second insulating layer. The second insulating layer, the grid, and the first insulating layer are then etched through the mask to form tunnels that expose portions of the first electrode. The mask is then removed. Any exposed portion of the grid may be oxidized to form an insulating oxide layer, or an additional insulating layer may be deposited to cover any such exposed portion. An organic layer is then deposited over the exposed portions of the first electrode, first insulating layer, grid, and second insulating layer. A second electrode is then deposited over the organic layer. Preferably, the grid is completely enclosed by insulating layers, such that there is no direct contact between the grid and the organic semiconductor, and current is blocked from flowing between the grid and the organic semiconductor.

Preferably, the mask is created as follows: A single layer of substantially close packed, similarly sized particles is deposited on the second insulating layer. The particles are then exposed to a process that reduces their size, thereby creating gaps between the particles. The mask material is then deposited, forming a mask in these gaps. The particles, and any mask material deposited thereon, are then removed, leaving the mask.

"Substantially close-packed" means that the particles are packed together almost as tightly as possible, but that significant deviations from an ideal close packed configuration are acceptable—such as 50% less particles than would be present in a close packed configuration. It is desirable but not necessary that the particles are in a regular pattern. Also, the particles may be in a substantially regular pattern, where "substantially regular" means that there may be some defects in the regular pattern. For example, there may be several regions of close-packed structure, separated by boundaries where the packing is irregular.

Figure 11:
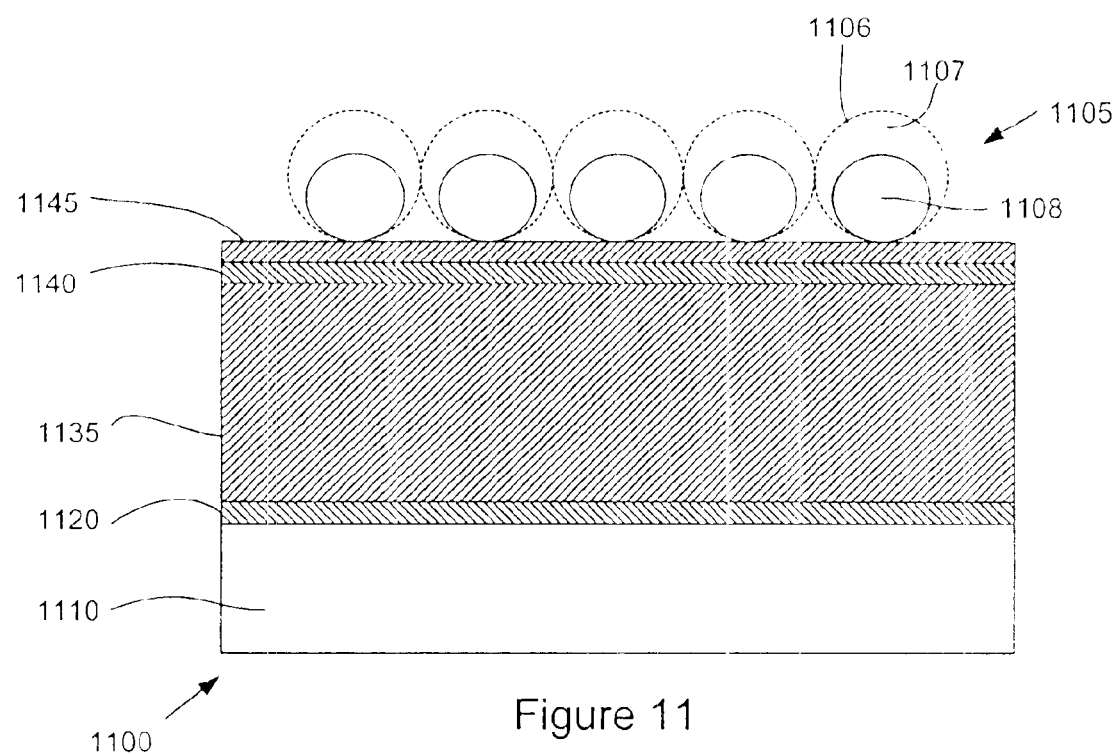
FIG. 11 schematically shows a partially fabricated organic triode 1100 in accordance with the second embodiment FIG. 12 schematically shows the partially fabricated triode 1100 of FIG. 11 after further processing FIG. 13 schematically shows the partially fabricated triode 1100 of FIG. 12 after further processing.

The particles may be reduced in size by any suitable process. For example, the particles may be reduced in size by reactive ion etching, or oxygen plasma etching. The particles should be thinner at the edges than in the middle to ensure that gaps are formed between the particles. For example, spheres are particularly well suited for this process. When a sphere is etched from above in a unidirectional manner, the edges are completely etched through before the middle, as illustrated by FIG. 11. Spheres also readily self-assemble into a substantially close-packed monolayer.

Suitable particle materials include polystyrene, silica, sapphire and gold. Preferably, the particles are polystyrene. For example, 100 nm polystyrene beads available from ALFA AESAR® may be used.

FIG. 11 schematically shows a partially fabricated organic triode 1100 in accordance with the second embodiment. First electrode 1120, first insulating layer 1135, grid 1140, and second insulating layer 1145 have been deposited, in that order, on substrate 1110. A monolayer of balls 1105 have been spread on top of second insulating layer 1145 in a substantially close-packed configuration, and then reduced in size to create gaps between the balls. Silhouette 1106 shows the original dimensions of balls 1105 prior to shrinking. In particular, region 1107 of balls 1105 is removed by etching, leaving region 1108 of balls 1105.

Figure 12:
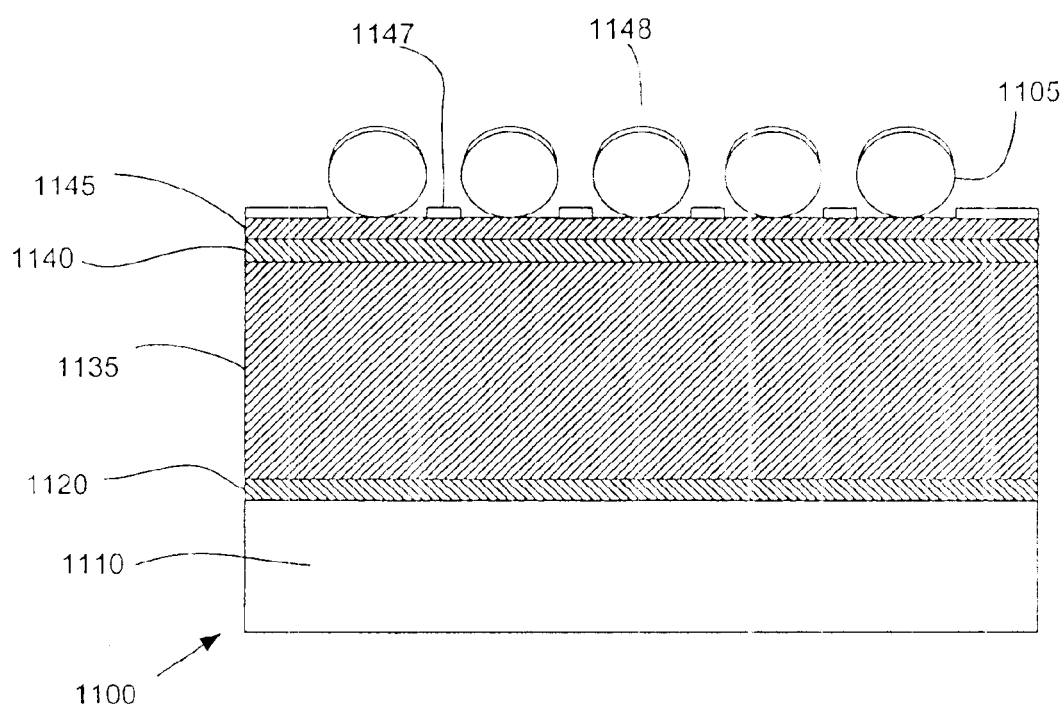

FIG. 12 schematically shows the partially fabricated triode 1100 of FIG. 11 after further processing. In particular, mask 1147 has been deposited through the gaps between balls 1105. Layer 1148 is also deposited on top of balls 1105 during the deposition of mask 1147.

Figure 13:
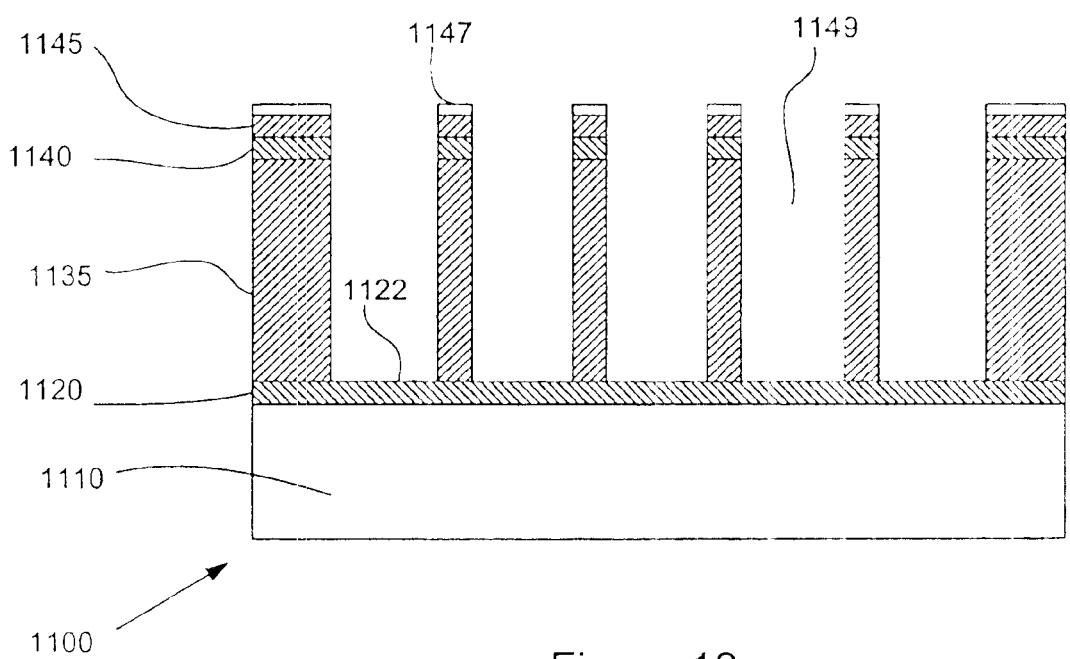

FIG. 13 schematically shows the partially fabricated triode 1100 of FIG. 12 after further processing. Balls 1105 and layer 1148 have been removed, for example by boiling in acetone with ultrasonic agitation, then rinsing with isopropanol to remove the acetone residue, leaving mask 1147. Second insulating layer 1145, grid 1140 and first insulating layer 1135 were then etched through mask 1147, forming tunnels 1149 that expose portions 1122 of first electrode 1120. At this point, viewed from above, partially fabricated triode 1100 looks similar to a honeycomb.

Preferably, once triode 1100 is fully fabricated, grid 1140 is completely separated from organic semiconductor layers 1130 and 1140 by insulating layers, such that current is blocked from flowing between grid 1140 and the organic semiconductor layers. This goal may be accomplished in a number of ways. The preferred way is illustrated in FIGS. 14 and 15.

Figure 14:
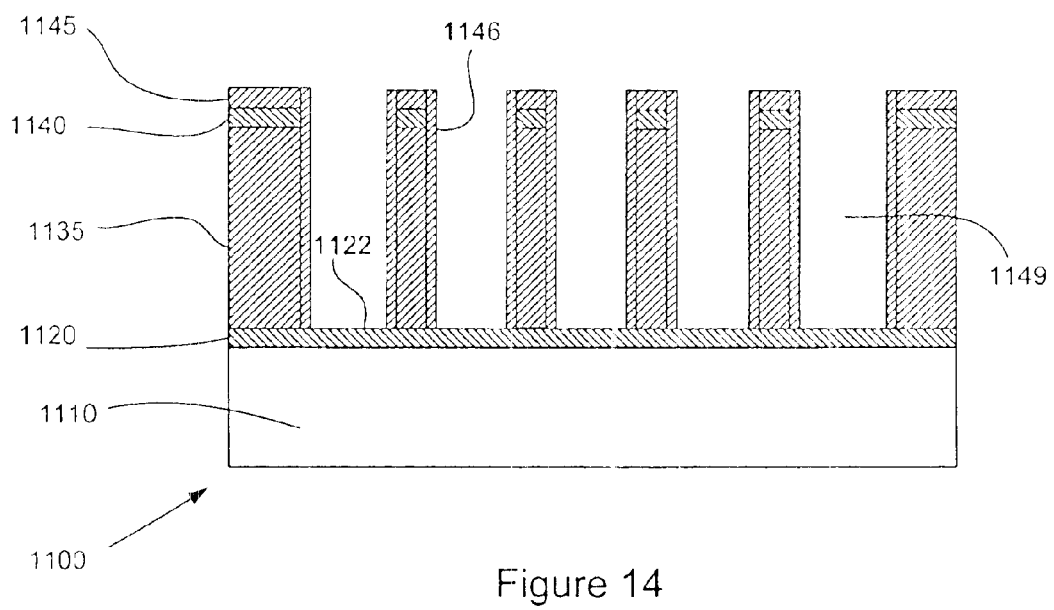
FIG. 14 schematically shows the partially fabricated triode 1100 of FIG. 13 after further processing.
Figure 15:
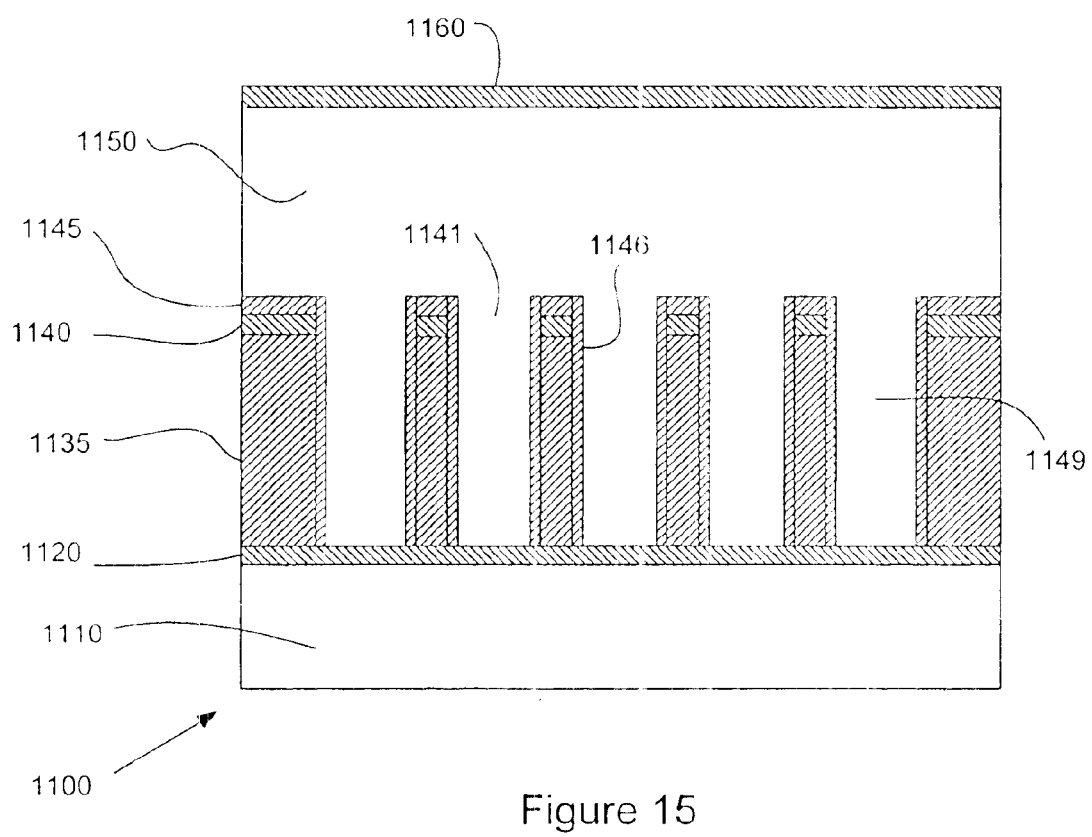
FIG. 15 schematically shows organic triode 1100 after it has been fully fabricated.

FIG. 14 schematically shows the partially fabricated triode 1100 of FIG. 13 after further processing. Side insulating layers 1146 may be fabricated by conformal deposition of an insulating material, followed by an anisotropic etch. In particular, conformal deposition is used to deposit insulating material everywhere, including vertical surfaces. Anisotropic etching is then used to remove the insulating material from horizontal surfaces, but not vertical surfaces. As a result, side insulating layers 1146 are fabricated.

Alternatively, side insulating layers 1146 may be fabricated by anisotropically depositing an insulating material from an angle while rotating triode 1100. In this way, grid 1140 may be completely enclosed by insulating layers 1135, 1145 and 1146, while not covering exposed portions 1122 of first electrode 1120. In this situation, side insulating layers 1146 may not look exactly as depicted in FIGS. 14 and 15. In particular, side insulating layers 1146 will likely not extend along the entire side of tunnel 1149, and may cover second insulating layer 1145.

Side insulating layers 1146 may also be omitted from this embodiment. If they are omitted, any exposed surfaces of grid 1140 may be oxidized after the deposition of second insulating layer 1145, but prior to the deposition of second organic layer 1150, such that the oxide forms an insulating layer.

FIG. 15 schematically shows organic triode 1100 after it has been fully fabricated. Mask 1147 has been removed.

Organic semiconductor layer 1150 was then deposited over the exposed portions of first electrode 1120, first insulating layer 1135, second insulating layer 1145, and side insulating layer 1146, filling tunnels 1149. Second electrode 1160 has also been deposited over second organic semiconductor layer 1150. Grid 1140 has openings 1141 at the entrance to tunnels 1149.

Preferred materials and dimensions are the same as for the embodiments of FIGS. 2–6.

Any embodiment of the invention, and preferably the third embodiment, may be used to fabricate a device with a grid having only one opening. Such a device could be used as an organic MOSFET.

While the present invention has been particularly shown and described with reference to particular embodiments thereof, it will be understood by those skilled in the art that various changes in form and details may be made therein without departing from the spirit and scope of the invention. While certain advantages that may be achieved using the invention have been described, it is similarly understood that a particular embodiment of the invention may not achieve all of these advantages.

What is claimed is:

1. A method of fabricating a device, comprising the steps of:
   (a) depositing a first organic semiconductor layer onto a first electrode;
   (b) pressing a patterned die into the first organic semiconductor layer to create texture in the surface of the first organic semiconductor layer;
   (c) removing the patterned die;
   (d) depositing a conductor onto the organic semiconductor layer from an angle to form a grid having openings as a result of the textured surface and the angular deposition;
   (e) depositing a second organic semiconductor layer over the grid and the first organic semiconductor layer;
   (f) depositing a second electrode onto the second organic semiconductor layer.

2. The method of claim 1, wherein the grid has a plurality of parallel electrically conductive lines.

3. The method of claim 1, wherein the grid comprises an electrically conductive sheet having an array of openings therein.

4. The method of claim 1, further comprising the steps of:
   depositing a first insulating layer after step (c) and before step (d);
   depositing a second insulating layer after step (d) and before step (e).

5. The method of claim 4, wherein angle of deposition is varied during the deposition of either or both of the first and second insulating layers such that the conductor is completely separated from the semiconductor layer by the first and second insulating layers.

6. The method of claim 4, further comprising the step of:
   oxidizing any exposed surface of the conductor after depositing the second insulating layer and before step (e).

7. The method of claim 1, wherein the first and second organic semiconducting layers comprise hole conducting materials, and the conductor comprises a metal having a work function greater than about 5 eV.

8. The method of claim 1, wherein the first and second organic semiconducting layers comprise electron conducting materials, and the conductor comprises a metal having a work function less than about 4 eV.

9. The method of claim 4, wherein the conductor comprises a material selected from the group consisting of gold and aluminum, and the first and second insulating layers comprise $SiN_x$.

10. The method of claim 4, wherein the first and second insulating layers comprise a material selected from the group consisting of $SiN_x$ and $SiO_2$.

11. The method of claim 1, wherein the conductor layer has a thickness of about 10–50 nm.

12. The method of claim 4, wherein the first and second insulating layers each have a thickness of about 5–50 nm.

13. The method of claim 1, wherein the first and second organic semiconductor layers each have a thickness of about 20–200 nm.

* * * * *

UNITED STATES PATENT AND TRADEMARK OFFICE
CERTIFICATE OF CORRECTION

PATENT NO. : 6,884,093 B2
DATED : April 26, 2005
INVENTOR(S) : Baldo et al.

It is certified that error appears in the above-identified patent and that said Letters Patent is hereby corrected as shown below:

Title page,
Item [75], Inventors, change "Stephan" to -- Stephen --.

Signed and Sealed this

Twenty-ninth Day of November, 2005

JON W. DUDAS
*Director of the United States Patent and Trademark Office*